(12) United States Patent
Ono et al.

(10) Patent No.: US 10,522,569 B2
(45) Date of Patent: Dec. 31, 2019

(54) HIGH SNR PIXEL DESIGN

(71) Applicant: Apple Inc., Cupertino, CA (US)

(72) Inventors: Shinya Ono, Cupertino, CA (US);
Chin-Wei Lin, San Jose, CA (US);
Hung Sheng Lin, San Jose, CA (US)

(73) Assignee: Apple Inc., Cupertino, CA (US)

( * ) Notice: Subject to any disclaimer, the term of this patent is extended or adjusted under 35 U.S.C. 154(b) by 464 days.

(21) Appl. No.: 15/339,376

(22) Filed: Oct. 31, 2016

(65) Prior Publication Data
US 2018/0061854 A1  Mar. 1, 2018

Related U.S. Application Data (60) Provisional application No. 62/380,091, filed on Aug. 26, 2016.

(51) Int. Cl.
*H01L 27/12* (2006.01)

(52) U.S. Cl.
CPC .................. *H01L 27/124* (2013.01)

(58) Field of Classification Search
CPC ..... H01L 27/124–1244; H01L 27/3276–3279; H01L 27/3288–329; H01L 27/3297; H01L 27/326; G09G 3/3208; G09G 2300/0426; G09G 3/3233

See application file for complete search history.

(56) References Cited

U.S. PATENT DOCUMENTS

| | | | |
|---|---|---|---|
| 2011/0128268 A1 | 6/2011 | Kim et al. | |
| 2012/0293451 A1* | 11/2012 | Van Schyndel | G06F 1/1643 345/174 |
| 2014/0022289 A1* | 1/2014 | Lee | G09G 3/3283 345/691 |
| 2014/0184579 A1* | 7/2014 | Kim | G09G 3/3208 345/212 |
| 2015/0055047 A1 | 2/2015 | Chang et al. | |

FOREIGN PATENT DOCUMENTS

JP  2004356052 A  12/2004

* cited by examiner

*Primary Examiner* — William F Kraig
*Assistant Examiner* — Khatib A Rahman
(74) *Attorney, Agent, or Firm* — Jaffery Watson Mendonsa & Hamilton LLP (57) ABSTRACT

Display panels including mirror pixel layouts and power rail bridges are described. In an embodiment, a display panel includes a plurality of power rail bridges joining together a subset of power rails for a plurality of adjacent mirror pixels within a row of mirror pixels.

14 Claims, 12 Drawing Sheets

| $V_{SS}$ Bridge | $V_{SS}$ Bridge | $V_{SS}$ Bridge | $V_{SS}$ Bridge | $V_{DD}$ Bridge | $V_{DD}$ Bridge | $V_{DD}$ Bridge | $V_{DD}$ Bridge |
|---|---|---|---|---|---|---|---|
| $V_{DD}$ Bridge | $V_{DD}$ Bridge | $V_{DD}$ Bridge | $V_{DD}$ Bridge | $V_{SS}$ Bridge | $V_{SS}$ Bridge | $V_{SS}$ Bridge | $V_{SS}$ Bridge |
| $V_{SS}$ Bridge | $V_{SS}$ Bridge | $V_{SS}$ Bridge | $V_{SS}$ Bridge | $V_{DD}$ Bridge | $V_{DD}$ Bridge | $V_{DD}$ Bridge | $V_{DD}$ Bridge |
| $V_{DD}$ Bridge | $V_{DD}$ Bridge | $V_{DD}$ Bridge | $V_{DD}$ Bridge | $V_{SS}$ Bridge | $V_{SS}$ Bridge | $V_{SS}$ Bridge | $V_{SS}$ Bridge |

*FIG. 5C*

| $V_{SS}$ Bridge | $V_{SS}$ Bridge | $V_{DD}$ Bridge | $V_{DD}$ Bridge |
|---|---|---|---|
| $V_{SS}$ Bridge | $V_{SS}$ Bridge | $V_{DD}$ Bridge | $V_{DD}$ Bridge |
| $V_{DD}$ Bridge | $V_{DD}$ Bridge | $V_{SS}$ Bridge | $V_{SS}$ Bridge |
| $V_{DD}$ Bridge | $V_{DD}$ Bridge | $V_{SS}$ Bridge | $V_{SS}$ Bridge |

HIGH SNR PIXEL DESIGN

RELATED APPLICATIONS

This application claims the benefit of priority of U.S. Provisional Application No. 62/380,091 filed Aug. 26, 2016, which is incorporated herein by reference.

BACKGROUND

Field

Embodiments described herein relate to active matrix displays, and more specifically to a power plane structure for an active matrix display.

Background Information

An active matrix display backplane for organic light emitting diode (OLED) displays or liquid crystal displays (LCD) may include scanning lines, data lines, and power supply lines such as high potential driving voltage supply lines ($V_{DD}$), low potential driving voltage supply lines ($V_{SS}$), and reference voltage (Vref) supply lines. Together the voltage supply lines may be referred to as a power plane that may overlay the pixel driving circuitry of the display, such as thin film transistor (TFT) pixel driving circuitry.

During operation of the display, such as displaying adjacent bright and dark image patterns, voltage distribution has been observed on the power supply lines at the boundaries of the bright/dark image patterns resulting luminance difference between the pixels.

SUMMARY

Display panels including mirror pixel layouts and power rail bridges are described. In an embodiment, a display panel includes a plurality power rails arranged in columns, and a plurality of mirror pixels arranged in rows and columns. Each mirror pixel may include a pair of subpixels, and a power rail of the plurality of power rails that is shared between the pair of subpixels. In accordance with embodiments, a plurality of power rail bridges join a subset of the power rails for a plurality of adjacent mirror pixels within a row of mirror pixels.

In an embodiment, the power rails are $V_{DD}$ power rails. The display panel may additionally include a plurality of Vref rails arranged in columns. In an embodiment, each mirror pixel includes a shared Vref rail. The display panel may additionally include a plurality of rows of Vdata lines arranged in columns, where a pair of Vdata lines overlap each column of mirror pixels. In an embodiment, each column of mirror pixels includes a vertical mirror center and the pair of Vdata lines is nearer the vertical mirror center of the mirror pixel than the shared $V_{DD}$ power rail. The pair of Vdata lines may be located over the Vref rail, and on laterally opposite sides of the Vref rail. In an embodiment, the pair of Vdata lines includes a first Vdata line laterally spaced apart from the shared $V_{DD}$ power rail by a first spacing, and a second Vdata line laterally spaced apart from a second $V_{DD}$ power rail of an adjacent mirror pixel within the row of mirror pixels by a second spacing that is a mirror spacing of the first spacing. The display panel may include additional power rails. For example, the display panel may include a plurality $V_{SS}$ power rails arranged in columns, and a plurality of $V_{SS}$ power rail bridges joining the $V_{SS}$ power rails for a plurality of adjacent mirror pixels within the row of mirror pixels.

In an embodiment, a mirror pixel includes a first subpixel and second subpixel, a Vref rail that is shared between the first and second subpixels, and a $V_{DD}$ power rail that is shared between the first and second subpixels. The mirror pixel may additionally include a first Vdata line coupled to the first subpixel, and a second Vdata line coupled to the second subpixel. In an embodiment, the first Vdata line and the second Vdata line are on laterally opposite sides of the Vref rail, and the Vref rail is nearer a vertical mirror center of the mirror pixel than the $V_{DD}$ power rail.

In an embodiment, a display panel includes a plurality of power rail bridges formed in a bridge layer. A first conductive layer including a plurality of columns of first power rails is formed over the bridge layer and connected to a first subset of the plurality of power rail bridges, and a second conductive player including a plurality of second power rails is formed over the first conductive layer and the bridge layer and connected to a second subset of the plurality of power rail bridges. Each power rail bridge may overlap a pair of subpixels within a mirror pixel. In an embodiment, the first subset of power rail bridges is arranged in a first checkerboard pattern. The first checkerboard pattern may include groups of power rail bridges arranged in a grouped checkerboard pattern. In a specific implementation, the first power rails are $V_{DD}$ power rails and the second power rails are $V_{SS}$ power rails. The first conductive layer may include a plurality of columns of Vref rails. In an embodiment, each power rail bridge overlaps a pair of subpixels within a mirror pixel, and each mirror pixel further includes a $V_{DD}$ power rail that is shared between the pair of subpixels, and a Vref rail that is shared between the pair of subpixels.

DETAILED DESCRIPTION

Embodiments describe power plane structures and pixel layouts for active matrix displays. In one aspect, it has been observed that noise from control signals and power lines may be particularly problematic when sensing pixel current through the data lines. In accordance with embodiments, power plane structures and high pixel density layouts are described to achieve improved signal to noise ratios (SNRs) for sensing. In particular, structures are described in accordance with embodiments that may achieve equal SNRs for even and odd pixel columns, which may facilitate reliable pixel current sensing along the data lines for external compensation.

In an embodiment, a display panel includes a plurality power rails arranged in columns, and a plurality of mirror pixels arranged in rows and columns. Each mirror pixel includes a pair of subpixels and a power rail of the plurality of power rails that is shared between the pair of subpixels. For example the power rail may be a $V_{DD}$ power rail, $V_{SS}$ power rail, or Vref power rail. In an embodiment, the power rail is a $V_{DD}$ power rail. In accordance with embodiments, a plurality of power rail bridges join a subset of the power rails for a plurality of adjacent mirror pixels within a row of mirror pixels. In such an arrangement, IR drop along the power rails may be reduced, and IR drop uniformity may be increased across the display panel.

In an embodiment, a mirror pixel includes a first subpixel and second subpixel, a Vref rail that is shared between the first and second subpixels, and a $V_{DD}$ power rail that is shared between the first and second subpixels. The mirror pixel may additionally include a first Vdata line coupled to the first subpixel, and a second Vdata line coupled to the second subpixel. In an embodiment, the first Vdata line and the second Vdata line are on laterally opposite sides of the Vref rail, and the Vref rail is nearer a vertical mirror center of the mirror pixel than the $V_{DD}$ power rail. In such an arrangement, location of the power rails (e.g. $V_{DD}$ power rails) at the horizontal edges of the mirror pixels provides both symmetry and the ability to locate data lines nearer a mirror center of the mirror pixels so as to reduce the parasitic effect of the power rails.

Embodiments additionally describe a stack-up structure and method of manufacture in which a plurality of power rail bridges are formed in a bridge layer, a first conductive layer including a plurality of columns of first power rails is formed over the bridge layer and connected to a first subset of the plurality of power rail bridges, and a second conductive player include a plurality of second power rails is formed over the first conductive layer and the bridge layer and is connected to a second subset of the plurality of power rail bridges. In such a configuration, a general bridge layer is formed that can support multiple different types of power rails (e.g. $V_{DD}$, $V_{SS}$, Vref) at multiple different levels (e.g. first conductive layer, second conductive layer) of the power plane.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer or feature with respect to other layers or features. One layer or feature "over", "spanning", "on", "connected to", or "coupled to" another layer or feature may be directly in contact with the other layer or feature, or may have one or more intervening layers or features. One layer or feature "between" layers or features may be directly in contact with the layers or features, or may have one or more intervening layers or features.

Figure 1A:
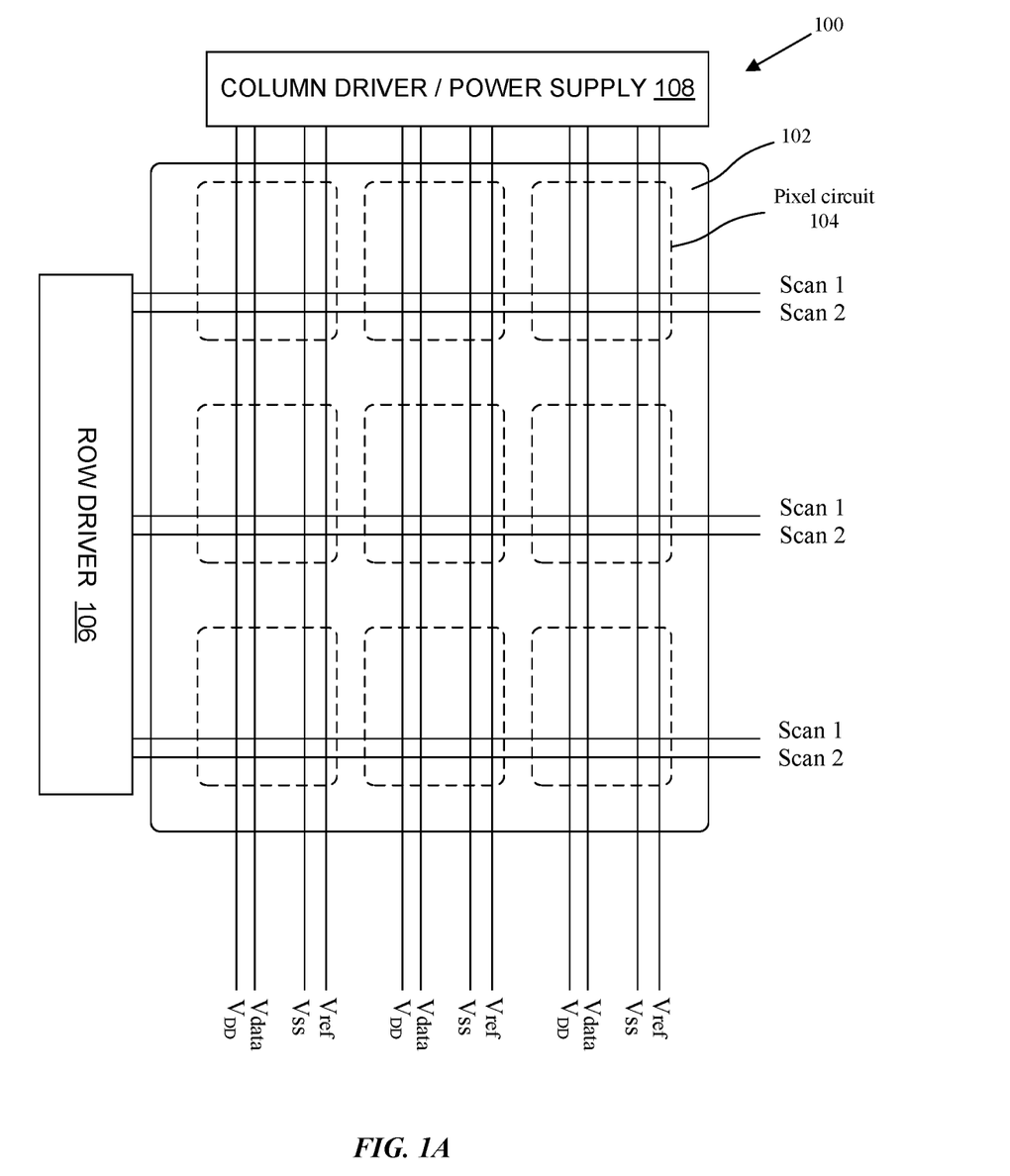
FIG. 1A is a schematic top view illustration of an active matrix display power plane.

Referring now to FIG. 1A a schematic top view illustration is provided of an active matrix display. As illustrated, the display panel 100 may include a display substrate 102 and a plurality of pixel circuits 104 arranged in rows and columns, with each pixel circuit 104 corresponding to a single subpixel. As shown, the exemplary display panel 100 includes a row driver 106 coupled to a plurality of rows of scan lines. Each scan line may be connected with a corresponding row of pixel circuits 104, for providing row select signals and sense signals to the rows of pixel circuits 104. The exemplary display panel 100 additionally includes a column driver/power supply 108 unit, for supplying power signals and data signals to the display substrate 102. The column driver/power supply 108 unit is illustrated as a single unit only in interests of convenience, and these may be separate units. In an embodiment, a plurality of data lines (Vdata) and power lines or power rails (e.g. $V_{DD}$ rails, $V_{SS}$ rails, Vref rails) are connected to the column driver/power supply 108 unit. For example, each column of pixel circuits 104 may have an associated column data (Vdata) line, $V_{DD}$ rail, $V_{SS}$ rail, and Vref rail.

Figure 1B:
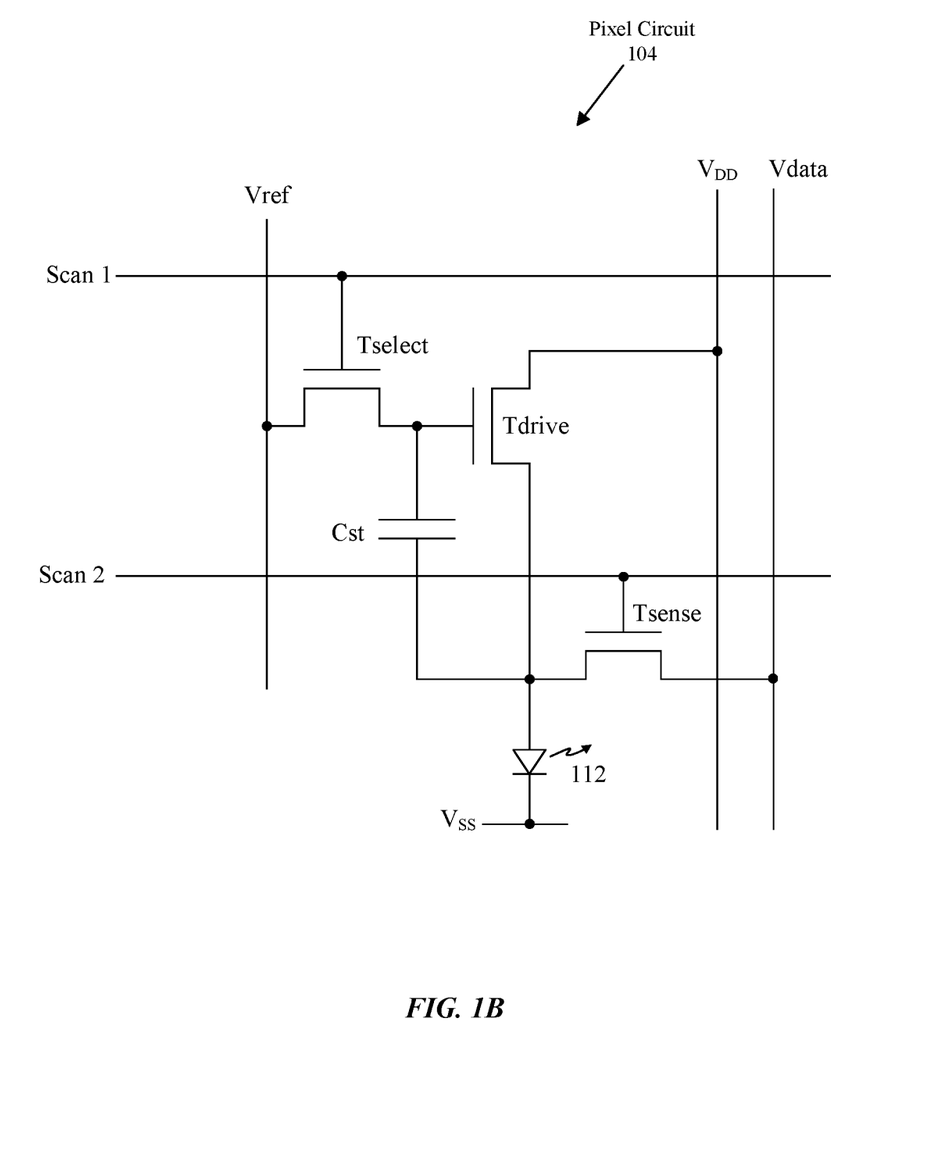
FIG. 1B is a circuit diagram of an exemplary pixel circuit.

An exemplary pixel circuit 104 is illustrated in FIG. 1B. The particular pixel circuit 104 illustrated includes a selection transistor (Tselect), storage capacitor (Cst), driving transistor (Tdrive) for driving a light emitting diode (LED) 112, which may be an OLED or inorganic LED, and sensing transistor (Tsense) for sensing the LED 112 pixel current. As shown, the $V_{DD}$ power rails and $V_{SS}$ power rails are power supplies for the LED 112 in an active matrix display.

In accordance with embodiments, display panel structures including mirror pixels and power plane structures with power rail bridges are described in order to reduce SNRs, particularly along the data lines. Thus, the display panel structures and layouts may facilitate reduced SNRs, and additionally be compatible with high density layouts in which a mirror pixel design with shared power rails can be used to reduce pixel area. In accordance with embodiments, each mirror pixel may include a pair of subpixels, with each of the subpixels including its own pixel electrode and corresponding LED 112. The subpixels within a mirror pixel, may additionally be designed for emission of a different color.

Figure 2:
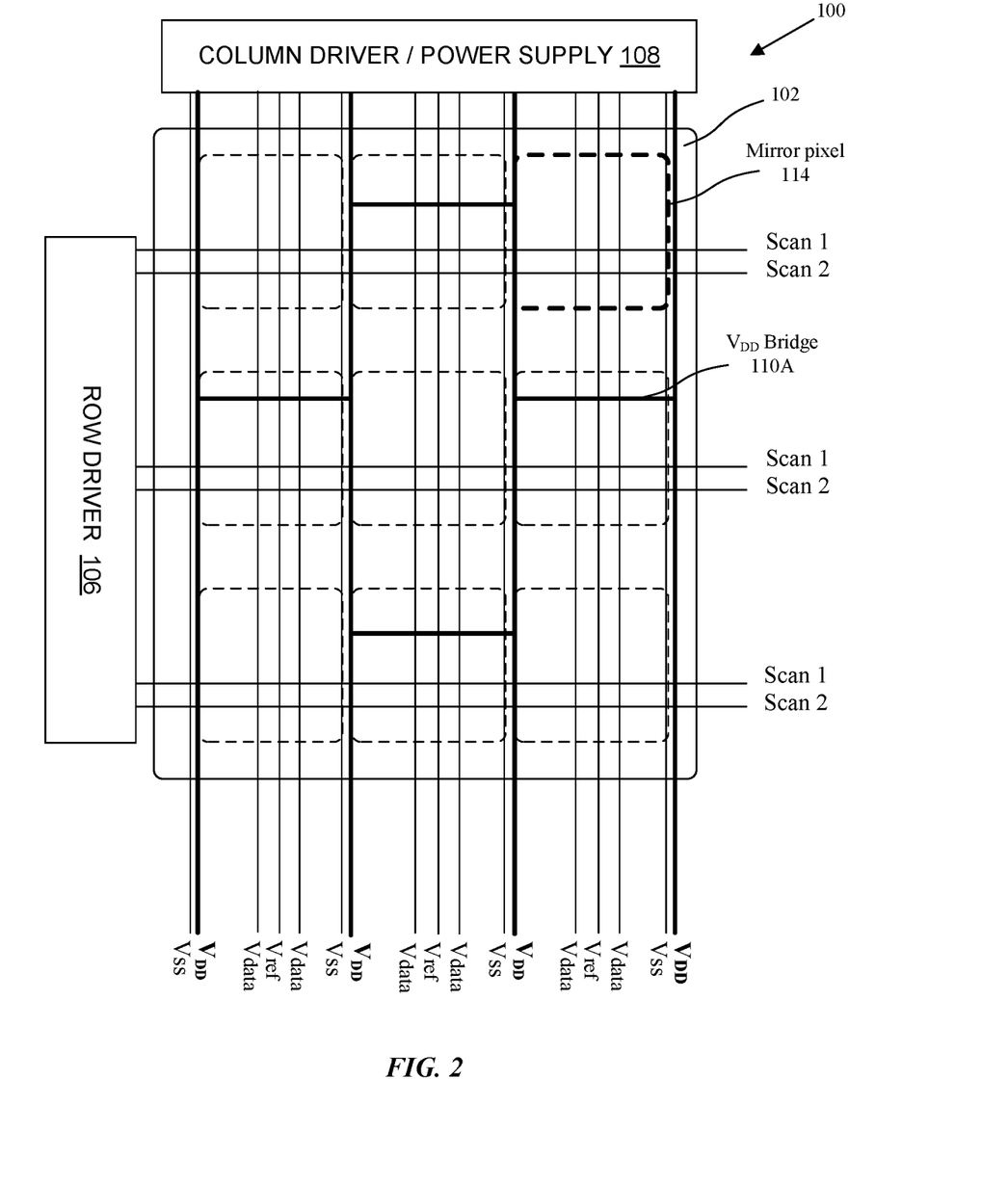
FIG. 2 is a schematic top view illustration of an active matrix display with mirror pixels including $V_{DD}$ bridges in accordance with an embodiment.

FIG. 2 is a schematic top view illustration of an active matrix display with mirror pixels 114 including $V_{DD}$ power rail bridges 110A in accordance with an embodiment. As illustrated, the display panel 100 includes a plurality of power rails ($V_{DD}$ power rails, $V_{SS}$ power rails, Vref power rails) arranged in columns, and a plurality of mirror pixels 114 arranged in rows and columns. Each mirror pixel 114 includes a pair of subpixels, and power rail that is shared between the pair of subpixels. In embodiment illustrated, each mirror pixel 114 includes a Vref rail that is shared between the pair of subpixels, and a $V_{DD}$ power rail that is shared between the pair of subpixels. Additionally, each mirror pixel 114 may include a $V_{SS}$ power rail that is shared between the pair of subpixels. In accordance with embodiments, each mirror pixel 114 may include a first Vdata line coupled to a first subpixel, and a second Vdata line coupled to the second subpixel of the pair of subpixels. In an embodiment, the Vref rail may be located nearer a vertical mirror center of the mirror pixel 114 than the $V_{DD}$ power rail. In an embodiment, the first Vdata line and the second Vdata line are on laterally opposite sides of the Vref rail. In an embodiment, the first Vdata line is laterally spaced apart from the shared $V_{DD}$ power rail by a first spacing, and the second Vdata line is laterally spaced apart from a second $V_{DD}$ power rail of an adjacent mirror pixel 114 within the row of mirror pixels by a second spacing that is a mirror spacing of the first spacing. In such an arrangement, location of the comparatively high and low potential power rails (e.g. $V_{DD}$ power rails, $V_{SS}$ power rails) at the horizontal edges of the mirror pixels 114 provides both symmetry and the ability to locate Vdata lines nearer a mirror center of the mirror pixels so as to reduce the parasitic effect of the comparatively high and low potential power rails.

Still referring to FIG. 2, the display panels 100 in accordance with embodiments additionally include a plurality of power rail bridges that join a subset of the power rails for a plurality of adjacent mirror pixels within a row of mirror pixels. In the particular embodiment illustrated in FIG. 2, the power rail bridges are $V_{DD}$ power rail bridges 110A that join $V_{DD}$ power rails.

Figure 3:
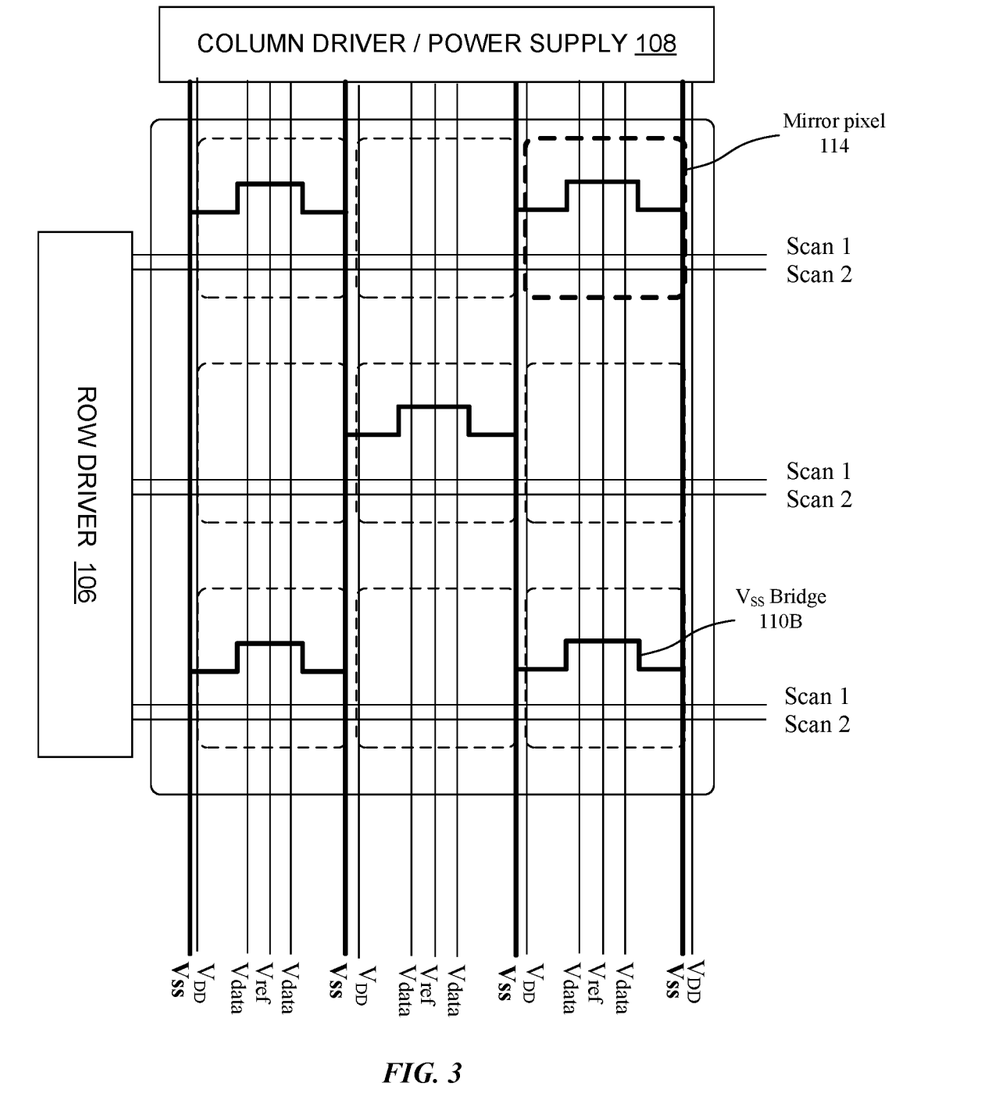
FIG. 3 is a schematic top view illustration of an active matrix display with mirror pixels including $V_{SS}$ bridges in accordance with an embodiment.
Figure 4:
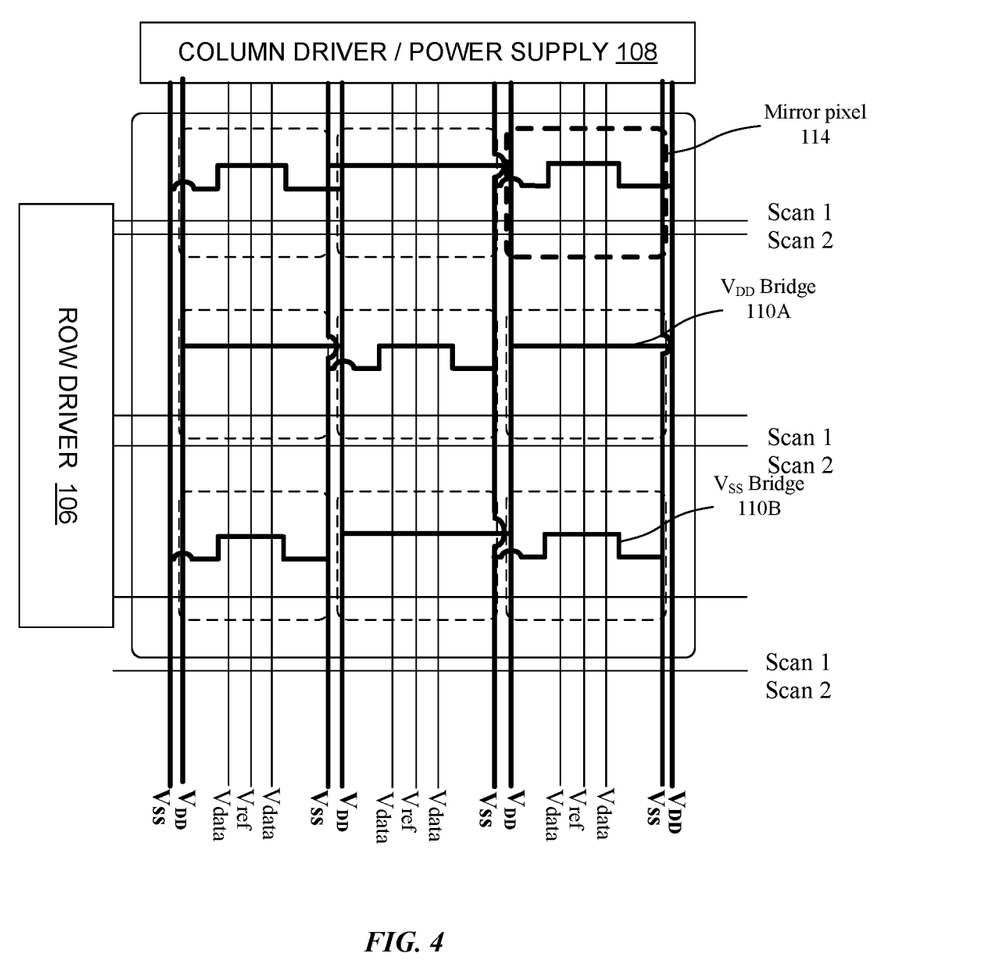
FIG. 4 is a schematic top view illustration of an active matrix display with mirror pixels including $V_{DD}$ and $V_{SS}$ bridges in accordance with an embodiment.
Figure 5A:
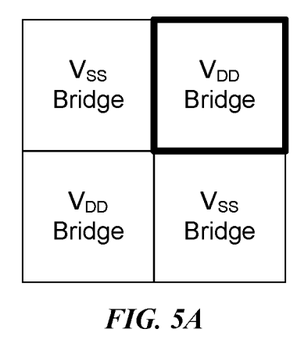
FIGS. 5A-5D are schematic illustrations of various power plane bridge arrangements in accordance with embodiments.
Figure 5B:
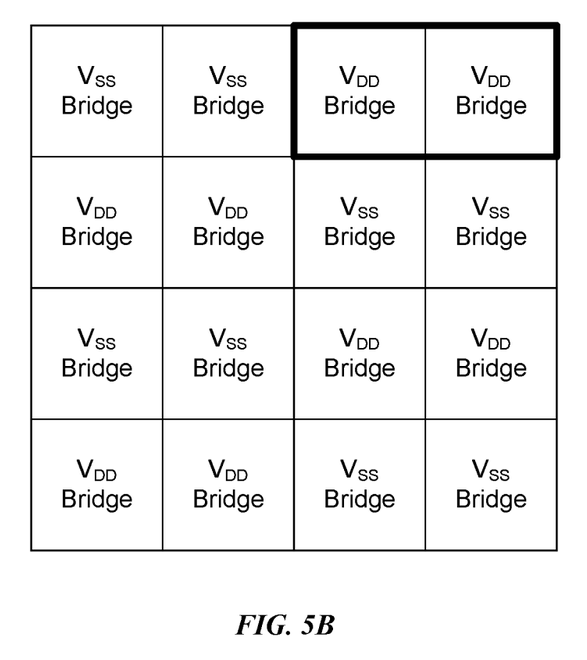
Figure 5C:
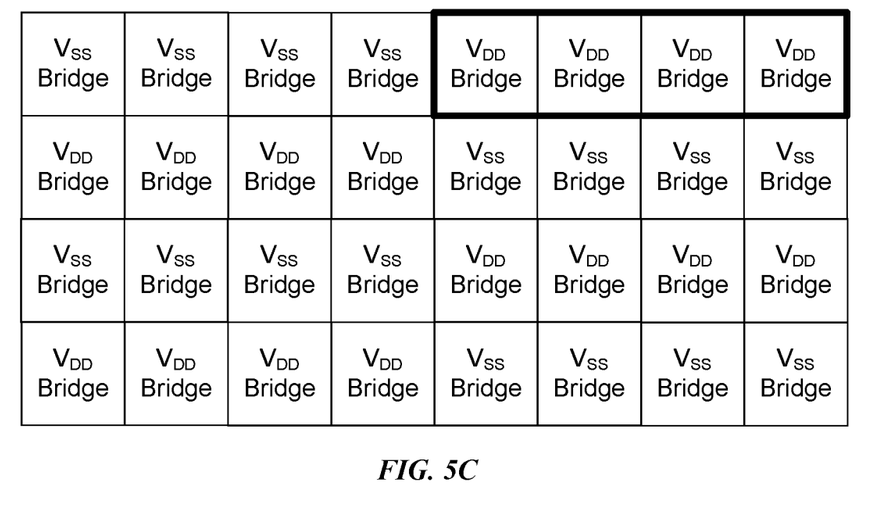
Figure 5D:
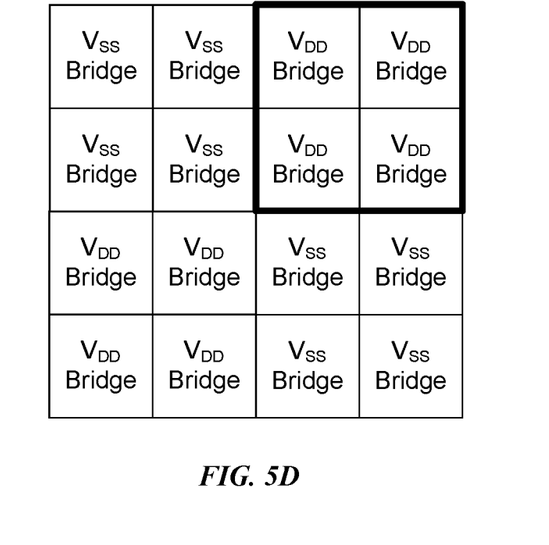

FIG. 3 is a schematic top view illustration of an active matrix display with mirror pixels 114 including $V_{SS}$ power rail bridges 110B in accordance with an embodiment. FIG. 4 is a schematic top view illustration of an active matrix display with mirror pixels including $V_{DD}$ power rail bridges 110A and $V_{SS}$ power rail bridges 110B in accordance with an embodiment. The $V_{DD}$ power rail bridges 110A and/or $V_{SS}$ power rail bridges 110B may be arranged in checkerboard patterns. For example, this may include both $V_{DD}$ power rail bridges 110A and $V_{SS}$ power rail bridges 110B each spanning across every other mirror pixel 114 within a row and/or column of mirror pixels. In other embodiments, the checkerboard patterns may be amongst groups of mirror pixels 114. While not specifically illustrated, the plurality of power rail bridges may additionally or alternatively include Vref power rail bridges.

FIGS. 5A-5D are schematic illustrations of various power plane bridge arrangements in accordance with embodiments. In the embodiment illustrated in FIG. 5A both $V_{DD}$ power rail bridges 110A and $V_{SS}$ power rail bridges 110B each span across every other mirror pixel 114 within a row and/or column of mirror pixels, or alternatively are connected to every other two power rails across rows and/or columns of mirror pixels. In the embodiment illustrated in FIG. 5B both $V_{DD}$ power rail bridges 110A and $V_{SS}$ power rail bridges 110B each span across every other two mirror pixels 114 within a row of mirror pixels, or alternatively are connected to every other three power rails across rows of mirror pixels. In the embodiment illustrated in FIG. 5C both $V_{DD}$ power rail bridges 110A and $V_{SS}$ power rail bridges 110B each span across every other four mirror pixels 114 within a row of mirror pixels, or alternatively are connected to every other five power rails across rows of mirror pixels. In the embodiment illustrated in FIG. 5D both $V_{DD}$ power rail bridges 110A and $V_{SS}$ power rail bridges 110B each span across every other two mirror pixels 114 within rows and columns of mirror pixels, or alternatively are connected to every other three power rails across multiple rows and columns of mirror pixels. The particular arrangements illustrated in FIGS. 5A-5D are exemplary in nature to illustrate potential implementations of embodiments, and the embodiments are not so limited.

Figure 6:
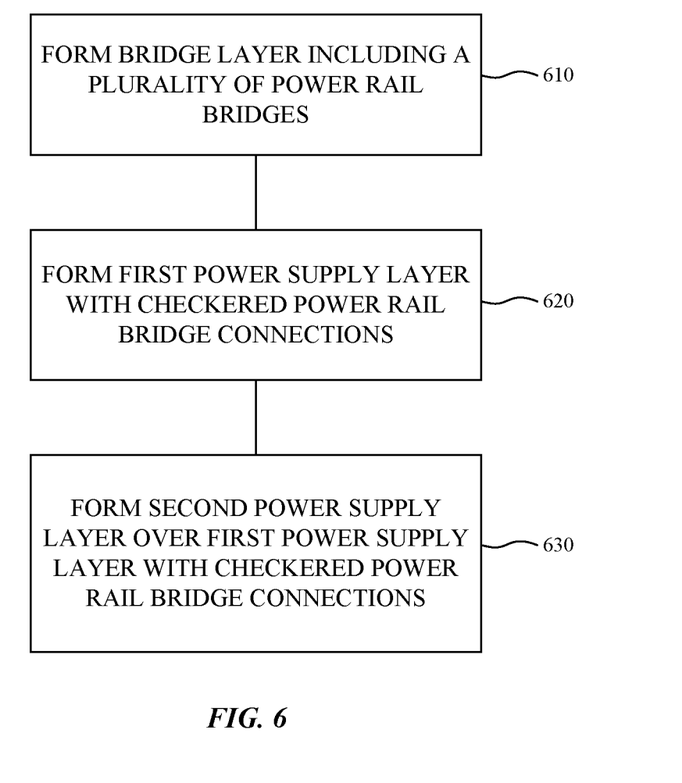
FIG. 6 is a flow chart of a method of forming a power plane in accordance with an embodiment.

FIG. 6 is a flow chart of a method of forming a power plane in accordance with an embodiment. In interests of clarity, description of the flow chart illustrated in FIG. 6 may be made with regard to the features illustrated in FIGS. 7A-8C.

Figure 7A:
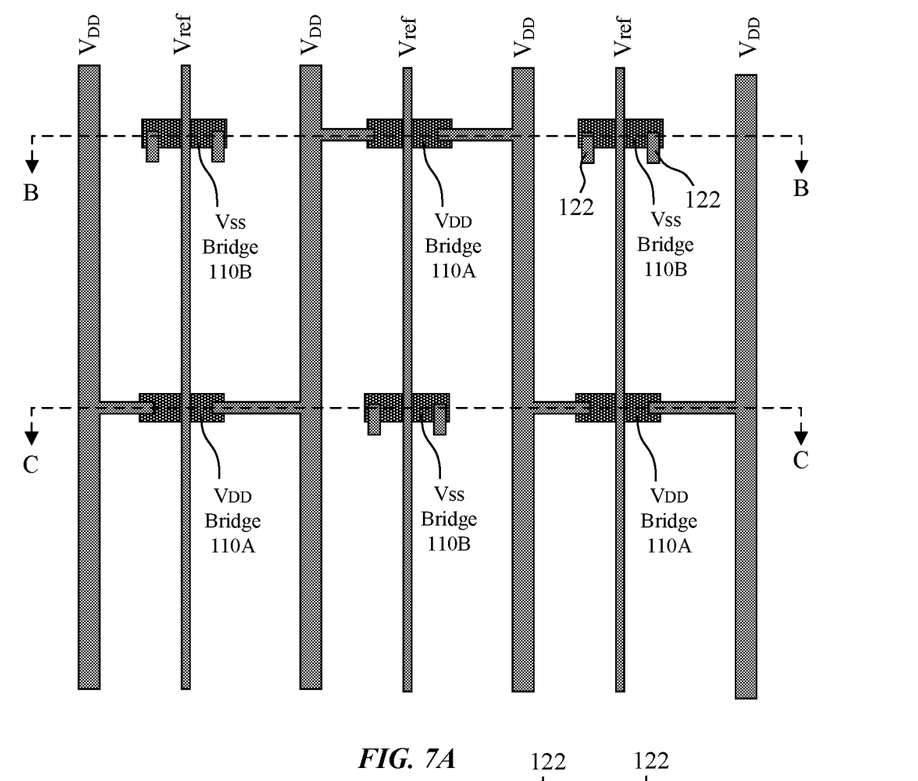
FIG. 7A is a schematic top view illustration of the formation of a first conductive layer over a bridge layer in accordance with an embodiment.
Figure 7B:
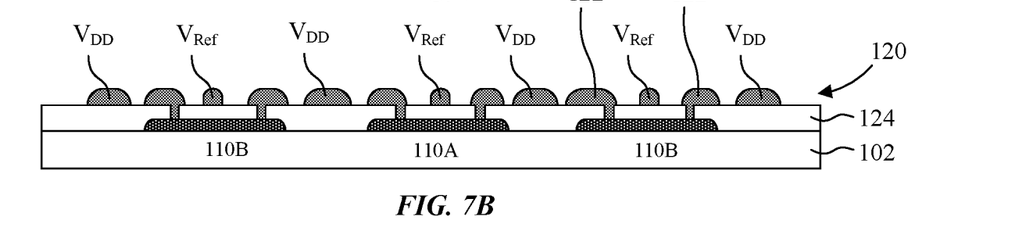
FIG. 7B is a cross-sectional side view illustration taken along line B-B of FIG. 7A in accordance with an embodiment.
Figure 7C:
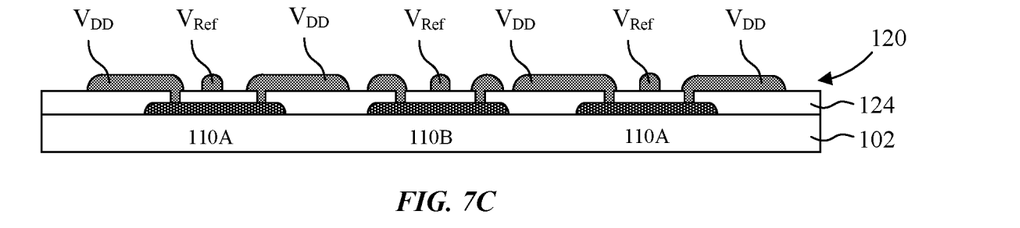
FIG. 7C is a cross-sectional side view illustration taken along line C-C of FIG. 7A in accordance with an embodiment.

At operation 610 a bridge layer including a plurality of power rail bridges is formed on a display substrate 102. For example, display substrate 102 may be a TFT substrate including pixel circuitry. In an embodiment, each power rail bridge may overlap a pair of subpixels, for example, of a mirror pixel. At operation 620 a first power supply layer is formed over the bridge layer. The first power supply layer may have checkerboard power rail bridge connections. FIG. 7A is a schematic top view illustration of the formation of a first conductive layer 120 over a bridge layer including a plurality of power rail bridges (e.g. $V_{DD}$ power rail bridges 110A, $V_{SS}$ power rail bridges 110B) in accordance with an embodiment. FIG. 7B is a cross-sectional side view illustration taken along line B-B of FIG. 7A in accordance with an embodiment. FIG. 7C is a cross-sectional side view illustration taken along line C-C of FIG. 7A in accordance with an embodiment. As illustrated in FIGS. 7A-7C, the first conductive layer 120 may include a plurality of $V_{DD}$ power rails, and a plurality of Vref power rails. In an embodiment, the $V_{DD}$ power rails are connected to a first subset of the plurality of power rail bridges (e.g. $V_{DD}$ power rail bridges 110A), and may be connected in a checkerboard pattern. In an embodiment, the first conductive layer 120 may additionally include power rail bridge interconnects 122, for connection with a subsequently formed conductive layer. The first conductive layer 120 may be separated from the underlying bridge layer by dielectric layer 124.

Figure 8A:
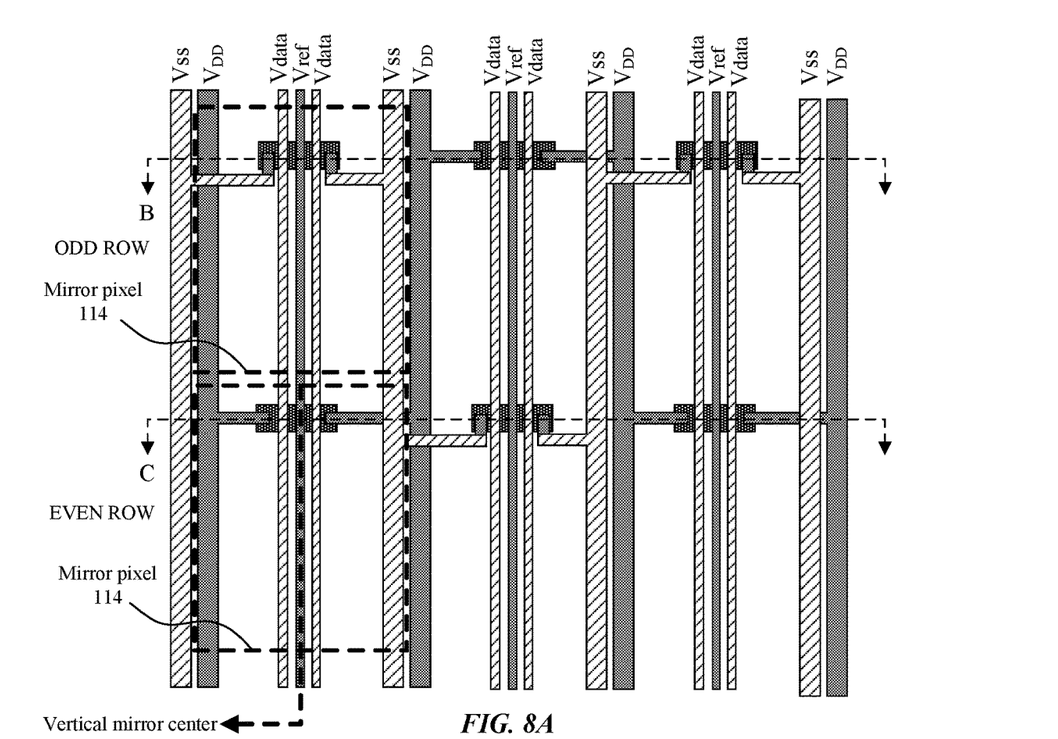
FIG. 8A is a schematic top view illustration of the formation of a second conductive layer over a first conductive layer and bridge layer in accordance with an embodiment.
Figure 8B:
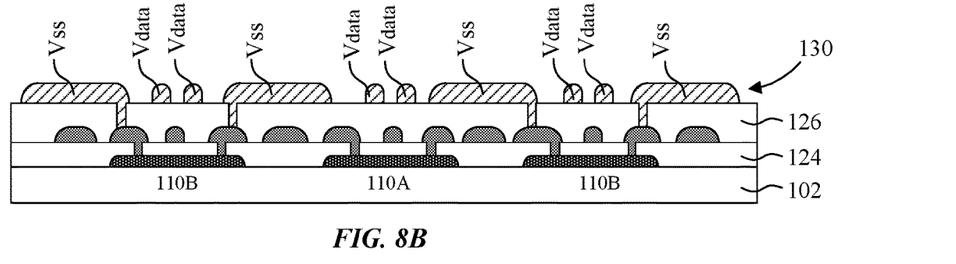
FIG. 8B is a cross-sectional side view illustration taken along line B-B of FIG. 8A in accordance with an embodiment.
Figure 8C:
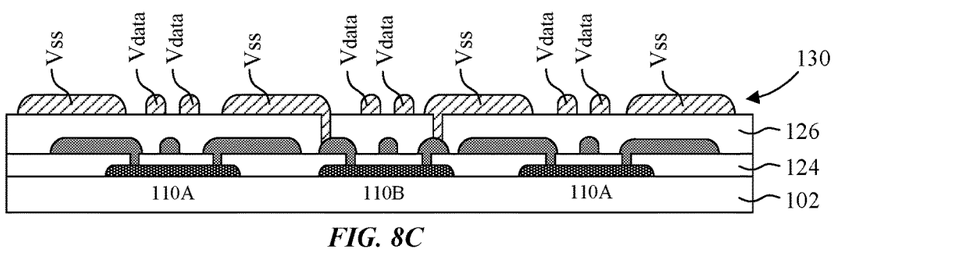
FIG. 8C is a cross-sectional side view illustration taken along line C-C of FIG. 8A in accordance with an embodiment.

At operation 630 a second power supply layer is formed over the first power supply layer. The second power supply layer may have checkerboard power rail bridge connections. FIG. 8A is a schematic top view illustration of the formation of a second conductive layer over a first conductive layer and bridge layer in accordance with an embodiment. FIG. 8B is a cross-sectional side view illustration taken along line B-B of FIG. 8A in accordance with an embodiment. FIG. 8C is a cross-sectional side view illustration taken along line C-C of FIG. 8A in accordance with an embodiment. The second conductive layer 130 may be separated from the underlying first conductive layer 120 by dielectric layer 126.

In the embodiment illustrated in FIG. 8C, the second conductive layer 130 may include a plurality of $V_{SS}$ power rails. The second conductive layer 130 may additionally include a plurality of Vdata lines. In an embodiment, the $V_{SS}$ power rails are connected to a first subset of the plurality of power rail bridges (e.g. $V_{SS}$ power rail bridges 110B), through the power rail bridge interconnects 122, and may be connected in a checkerboard pattern.

In an embodiment, each power rail bridge 110A, 110B overlaps a pair of subpixels within a mirror pixel 114. Each mirror pixel 114 additionally includes a $V_{DD}$ power rail that is shared between the pair of subpixels, and a Vref rail that is shared between the pair of subpixels. In an embodiment, the Vref rail is nearer a vertical mirror center of the mirror pixels 114 than the shared $V_{DD}$ power rail (and $V_{SS}$ power rail). The pair of Vdata lines on opposite sides of the shared Vref rail may also be nearer the vertical mirror center of the mirror pixels 114 than the $V_{DD}$ power rail (and $V_{SS}$ power rail). In an embodiment, the pair of Vdata lines within a mirror pixel 114 includes a first Vdata line laterally spaced apart from the shared $V_{DD}$ power rail by a first spacing, and a second Vdata line laterally spaced apart from a second $V_{DD}$ power rail of an adjacent mirror pixel 114 within the row of mirror pixels by a second spacing that is a mirror spacing of the first spacing.

Figure 9:
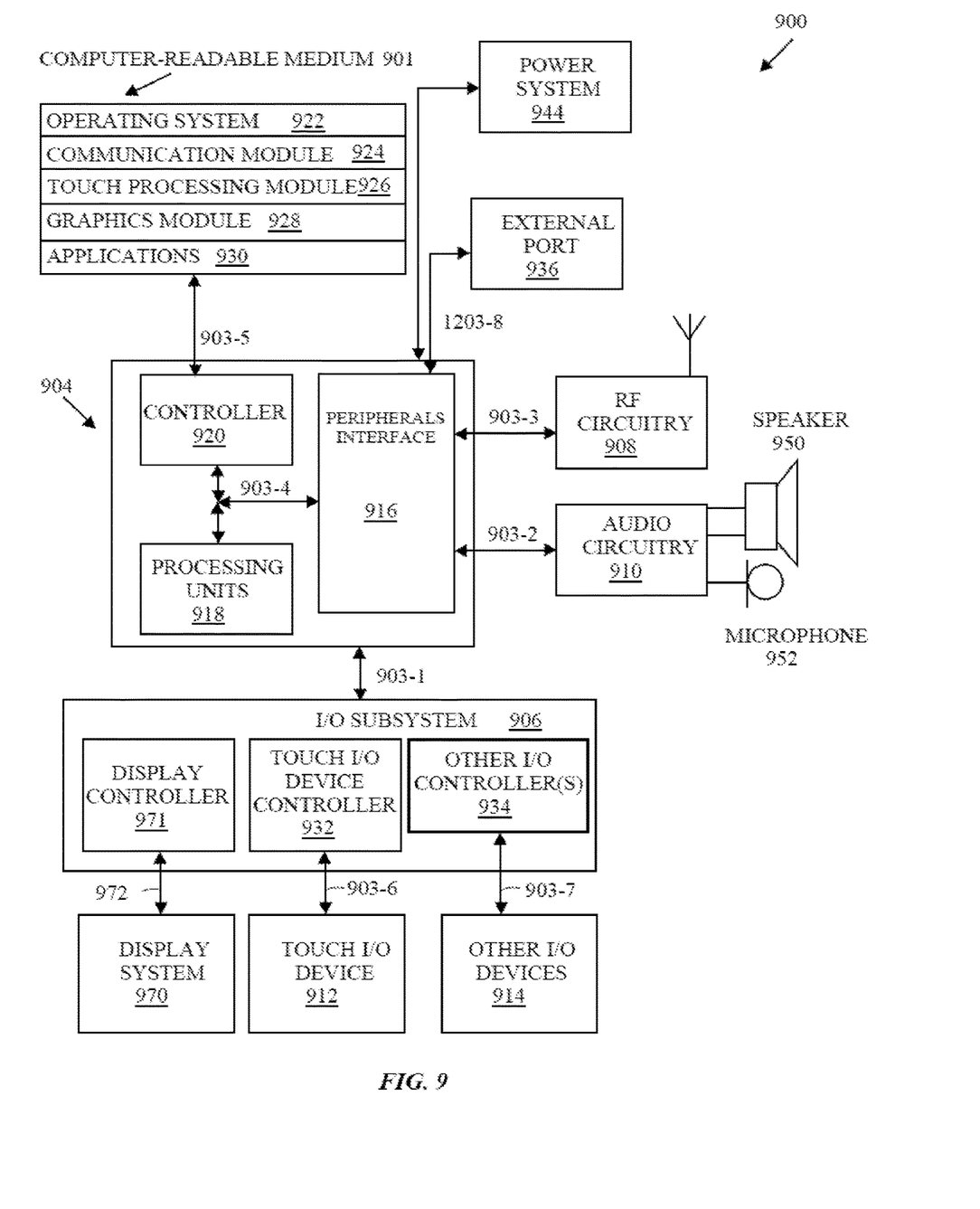
FIG. 9 is a block diagram of one embodiment of a system that generally includes one or more computer-readable mediums, processing system, Input/Output (I/O) subsystem, radio frequency (RF) circuitry and audio circuitry.
Figure 10:
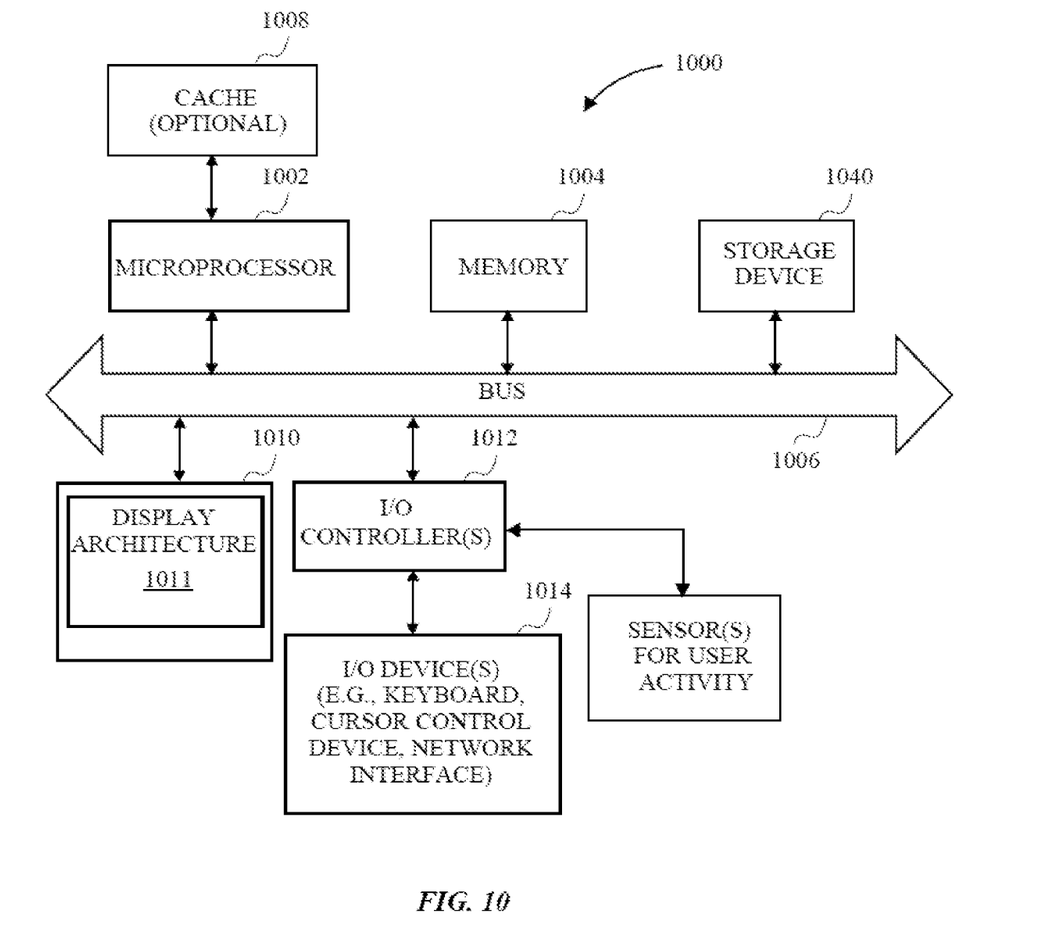
FIG. 10 shows another example of a device in accordance with an embodiment.

In some embodiments, the methods, systems, display panels and pixel elements of the present disclosure can be implemented in various devices including electronic devices, consumer devices, data processing devices, desktop computers, portable computers, wireless devices, cellular devices, tablet devices, display screens, televisions, handheld devices, multi touch devices, multi touch data processing devices, wearable devices, any combination of these devices, or other like devices. FIG. 9 and FIG. 10 illustrate examples of a few of these devices.

Attention is now directed towards embodiments of a system architecture that may be embodied within any portable or non-portable device including but not limited to a communication device (e.g., mobile phone, smart phone, smart watch, wearable device), a multi-media device (e.g., MP3 player, TV, radio), a portable or handheld computer (e.g., tablet, netbook, laptop), a desktop computer, an All-In-One desktop, a peripheral device, a television, or any other system or device adaptable to the inclusion of system architecture, including combinations of two or more of these types of devices.

FIG. 9 is a block diagram of one embodiment of the system 900 that generally includes one or more computer-readable mediums 901, processing system 904, Input/Output (I/O) subsystem 906, radio frequency (RF) circuitry 908 and audio circuitry 910. These components may be coupled by one or more communication buses or signal lines 903 (e.g., 903-1, 903-2, 903-3, 903-4, 903-5, 903-6, 903-7, 908-8).

It should be apparent that the architecture shown in FIG. 9 is only one example architecture of system 900, and that system 900 could have more or fewer components than shown, or a different configuration of components. The various components shown in FIG. 9 can be implemented in hardware, software, firmware or any combination thereof, including one or more signal processing and/or application specific integrated circuits.

RF circuitry 908 is used to send and receive information over a wireless link or network to one or more other devices and includes well-known circuitry for performing this function. RF circuitry 908 and audio circuitry 910 are coupled to processing system 904 via peripherals interface 916. Interface 916 includes various known components for establishing and maintaining communication between peripherals and processing system 904. Audio circuitry 910 is coupled to audio speaker 950 and microphone 952 and includes known circuitry for processing voice signals received from interface 916 to enable a user to communicate in real-time with other users. In some embodiments, audio circuitry 910 includes a headphone jack (not shown).

Peripherals interface 916 couples the input and output peripherals of the system to processing units 918 and computer-readable medium 901. One or more processing units 918 communicate with one or more computer-readable mediums 901 via controller 920. Computer-readable medium 901 can be any device or medium (e.g., storage device, storage medium) that can store code and/or data for use by one or more processing units 918. Medium 901 can include a memory hierarchy, including but not limited to cache, main memory and secondary memory. The memory hierarchy can be implemented using any combination of RAM (e.g., SRAM, DRAM, DDRAM), ROM, FLASH, magnetic and/or optical storage devices, such as disk drives, magnetic tape, CDs (compact disks) and DVDs (digital video discs). Medium 901 may also include a transmission medium for carrying information-bearing signals indicative of computer instructions or data (with or without a carrier wave upon which the signals are modulated). For example, the transmission medium may include a communications network, including but not limited to the Internet (also referred to as the World Wide Web), intranet(s), Local Area Networks (LANs), Wide Local Area Networks (WLANs), Storage Area Networks (SANs), Metropolitan Area Networks (MAN) and the like.

One or more processing units 918 run various software components stored in medium 901 to perform various functions for system 900. In some embodiments, the software components include operating system 922, communication module (or set of instructions) 924, touch processing module (or set of instructions) 926, graphics module (or set of instructions) 928, and one or more applications (or set of instructions) 930. In some embodiments, medium 901 may store a subset of the modules and data structures identified above. Furthermore, medium 901 may store additional modules and data structures not described above.

Operating system 922 includes various procedures, sets of instructions, software components and/or drivers for controlling and managing general system tasks (e.g., memory management, storage device control, power management, etc.) and facilitates communication between various hardware and software components.

Communication module 924 facilitates communication with other devices over one or more external ports 936 or via RF circuitry 908 and includes various software components for handling data received from RF circuitry 908 and/or external port 936.

Graphics module 928 includes various known software components for rendering, animating and displaying graphical objects on a display surface. In embodiments in which touch I/O device 912 is a touch sensitive display (e.g., touch screen), graphics module 928 includes components for rendering, displaying, and animating objects on the touch sensitive display. The display panel 100 and mirror pixel layouts of the present design may be implemented with display system 970 which may be coupled with a display controller 1271 via communication link 972.

One or more applications 930 can include any applications installed on system 900, including without limitation, a game center application, a browser, address book, contact list, email, instant messaging, word processing, keyboard emulation, widgets, JAVA-enabled applications, encryption, digital rights management, voice recognition, voice replication, location determination capability (such as that provided by the global positioning system (GPS)), a music player, etc.

Touch processing module 926 includes various software components for performing various tasks associated with touch I/O device 912 including but not limited to receiving and processing touch input received from I/O device 912 via touch I/O device controller 932.

FIG. 10 shows another example of a device according to an embodiment of the disclosure. This device 1000 may include one or more processors, such as microprocessor(s) 1002, and a memory 1004, which are coupled to each other through a bus 1006. The device 1000 may optionally include a cache 1008 which is coupled to the microprocessor(s) 1002. The device may optionally include a storage device 1040 which may be, for example, any type of solid-state or magnetic memory device. Storage device 1040 may be or include a machine-readable medium.

This device may also include a display controller and display device 1010 which is coupled to the other components through the bus 1006. The display panel 100 and mirror pixel layouts of the present design may be implemented in the display device 1010 and display controller.

One or more input/output controllers 1012 are also coupled to the bus 1006 to provide an interface for input/output devices 1014 and to provide an interface for one or more sensors 1016 which are for sensing user activity. The bus 1006 may include one or more buses connected to each other through various bridges, controllers, and/or adapters as is well known in the art. The input/output devices 1014 may include a keypad or keyboard or a cursor control device such as a touch input panel. Furthermore, the input/output devices 1014 may include a network interface which is either for a wired network or a wireless network (e.g. an RF transceiver). The sensors 1016 may be any one of the sensors described herein including, for example, a proximity sensor or an ambient light sensor. In at least certain implementations of the device 1000, the microprocessor(s) 1002 may receive data from one or more sensors 1016 and may perform the analysis of that data in the manner described herein.

In certain embodiments of the present disclosure, the device/system 1000 or 900 or combinations of device/system 1000/900 can be used to drive display data to a display device and implement at least some of the methods discussed in the present disclosure.

In utilizing the various aspects of the embodiments, it would become apparent to one skilled in the art that combinations or variations of the above embodiments are possible for forming a display panel with mirror pixels and power rail bridges. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display panel comprising:
    a plurality power rails arranged in columns;
    a plurality of Vref rails arranged in columns;
    a plurality of Vdata lines arranged in columns;
    a plurality of mirror pixels arranged in rows and columns, each mirror pixel including:
        a pair of subpixels;
        a power rail of the plurality of power rails that is shared between the pair of subpixels; and
        a Vref rail of the plurality of Vref rails that is shared between the pair of subpixels; and
        a pair of Vdata lines of the plurality of Vdata lines, wherein the pair of data lines are on laterally opposite sides of the Vref rail;
    a plurality of power rail bridges joining a subset of the power rails for a plurality of adjacent mirror pixels within a row of mirror pixels.

2. The display of claim 1, wherein the power rails are $V_{DD}$ power rails.

3. The display panel power plane of claim 2, wherein each column of mirror pixels includes a vertical mirror center and the pair of Vdata lines is nearer the vertical mirror center of the mirror pixel than the shared $V_{DD}$ power rail.

4. The display panel of claim 3, wherein the pair of Vdata lines are over the Vref rail.

5. The display panel of claim 4, wherein the pair of Vdata lines includes a first Vdata line laterally spaced apart from the shared $V_{DD}$ power rail by a first spacing, and a second Vdata line laterally spaced apart from a second $V_{DD}$ power rail of an adjacent mirror pixel within the row of mirror pixels by a second spacing that is a mirror spacing of the first spacing.

6. The display panel of claim 2, further comprising:
    a plurality $V_{SS}$ power rails arranged in columns;
    a plurality of $V_{SS}$ power rail bridges joining the $V_{SS}$ power rails for a plurality of adjacent mirror pixels within the row of mirror pixels.

7. A mirror pixel comprising:
    a first subpixel and a second subpixel;
    a Vref rail that is shared between the first and second subpixels;
    a $V_{DD}$ power rail that is shared between the first and second subpixels;
    a first Vdata line coupled to the first subpixel; and
    a second Vdata line coupled to the second subpixel;
    wherein the Vref rail is nearer a vertical mirror center of the mirror pixel than the $V_{DD}$ power rail.

8. The mirror pixel of claim 7, wherein the first Vdata line and the second Vdata line are on laterally opposite sides of the Vref rail.

9. A mirror pixel comprising:
    a first subpixel and a second subpixel;
    a Vref rail that is shared between the first and second subpixels;
    a $V_{DD}$ power rail that is shared between the first and second subpixels;
    a first Vdata line coupled to the first subpixel; and
    a second Vdata line coupled to the second subpixel;
    wherein the first Vdata line and the second Vdata line are on laterally opposite sides of the Vref rail.

10. A display panel comprising:
    a bridge layer including a plurality of power rail bridges overlapping a plurality of pixels;
    a first conductive layer over the bridge layer, the first conductive layer including a plurality of columns of $V_{DD}$ power rails connected to a first subset of the plurality of power rail bridges;
    a second conductive layer over the first conductive layer, the second conductive layer including a plurality of columns of $V_{SS}$ power rails connected to a second subset of the plurality of power rail bridges;
    wherein each power rail bridge overlaps a pair of subpixels within a mirror pixel.

11. The display panel of claim 10, wherein the first subset of power rail bridges is arranged in a first checkerboard pattern.

12. The display panel of claim 11, wherein the first checkerboard pattern includes groups of power rail bridges arranged in a grouped checkerboard pattern.

13. The display panel of claim 10, wherein the first conductive layer further comprises a plurality of columns of Vref rails.

14. The display panel of claim 13, wherein each mirror pixel further includes:
   a $V_{DD}$ power rail that is shared between the pair of subpixels; and
   a Vref rail that is shared between the pair of subpixels.

\* \* \* \* \*